(12) United States Patent
Keech et al.

(10) Patent No.: US 11,610,783 B2
(45) Date of Patent: Mar. 21, 2023

(54) ULTRASONIC TANK AND METHODS FOR UNIFORM GLASS SUBSTRATE ETCHING

(71) Applicant: CORNING INCORPORATED, Corning, NY (US)

(72) Inventors: John Tyler Keech, Painted Post, NY (US); Stephen Kuo-Rui Liu, Fremont, CA (US)

(73) Assignee: CORNING INCORPORATED, Corning, NY (US)

( * ) Notice: Subject to any disclaimer, the term of this patent is extended or adjusted under 35 U.S.C. 154(b) by 210 days.

(21) Appl. No.: 14/810,967

(22) Filed: Jul. 28, 2015

(65) Prior Publication Data

US 2016/0035587 A1 Feb. 4, 2016

Related U.S. Application Data

(60) Provisional application No. 62/030,839, filed on Jul. 30, 2014.

(51) Int. Cl.
| | |
|---|---|
| *H01L 21/48* | (2006.01) |
| *C03C 15/00* | (2006.01) |
| *H01L 21/67* | (2006.01) |
| *B06B 1/02* | (2006.01) |
| *H05K 3/00* | (2006.01) |

(52) U.S. Cl.
CPC ............ *H01L 21/4803* (2013.01); *B06B 1/02* (2013.01); *C03C 15/00* (2013.01); *H01L 21/67086* (2013.01); *H05K 3/002* (2013.01); *H05K 2203/0285* (2013.01)

(58) Field of Classification Search
None
See application file for complete search history.

(56) References Cited

U.S. PATENT DOCUMENTS

| | | | |
|---|---|---|---|
| 4,957,583 A * | 9/1990 | Buck | C23F 1/08 |
| | | | 156/345.11 |
| 5,379,785 A * | 1/1995 | Ohmori | H01L 21/67057 |
| | | | 134/184 |
| 5,511,569 A * | 4/1996 | Mukogawa | B08B 3/04 |
| | | | 134/104.1 |
| 5,911,232 A | 6/1999 | Mokuo et al. | |
| | (Continued) | | |

FOREIGN PATENT DOCUMENTS

| | | |
|---|---|---|
| CN | 1883034 A | 12/2006 |
| CN | 100449699 C | 1/2009 |
| | (Continued) | |

OTHER PUBLICATIONS

Patent Cooperation Treaty International Notification of Transmittal of the International Search Report and The Written Opinion of the International Searching Authority, international application No. PCT/US2015/042398: dated Oct. 9, 2015, 13 pages.

(Continued)

*Primary Examiner* — Sylvia MacArthur

(57) ABSTRACT

In some embodiments, an ultrasonic tank includes a container, an etching solution tank comprising a working area disposed within the container, and a plurality of ultrasonic transducers arranged about a perimeter of the etching solution tank in a configuration that provides a standard deviation of ultrasonic power within the working area of less than about 0.35.

31 Claims, 14 Drawing Sheets

(56) References Cited

U.S. PATENT DOCUMENTS

| | | | |
|---|---|---|---|
| 6,077,721 | A | 6/2000 | Fukada et al. |
| 6,224,713 | B1* | 5/2001 | Hembree ............ B81C 1/00539 |
| | | | 156/345.11 |
| 6,358,761 | B1 | 3/2002 | Yoo et al. |
| 6,675,817 | B1 | 1/2004 | Doh |
| 6,796,315 | B2* | 9/2004 | Lu ............................ B08B 3/12 |
| | | | 134/1 |
| 7,165,565 | B2* | 1/2007 | Tolles ...................... B08B 3/12 |
| | | | 134/184 |
| 7,495,371 | B2 | 2/2009 | Goodson |
| 7,648,582 | B2* | 1/2010 | Steger ...................... B08B 3/12 |
| | | | 134/1 |
| 8,327,861 | B2* | 12/2012 | Yin ........................... B08B 3/12 |
| | | | 134/95.1 |
| 8,475,642 | B2 | 7/2013 | West et al. |
| 9,505,651 | B2 | 11/2016 | Gu et al. |
| 9,926,225 | B2 | 3/2018 | Gu et al. |
| 2004/0079483 | A1* | 4/2004 | Doh ......................... B08B 3/12 |
| | | | 156/345.11 |
| 2004/0163682 | A1* | 8/2004 | Boyd ................. H01L 21/67057 |
| | | | 134/33 |
| 2004/0238119 | A1* | 12/2004 | Chang ............... H01L 21/31111 |
| | | | 156/345.11 |
| 2013/0089701 | A1* | 4/2013 | Hooper .................. B23K 26/00 |
| | | | 428/131 |
| 2013/0247615 | A1 | 9/2013 | Boek et al. |
| 2015/0001156 | A1 | 1/2015 | Johnson |
| 2015/0060402 | A1 | 5/2015 | Burkett et al. |
| 2015/0140675 | A1 | 5/2015 | Xu |
| 2015/0166395 | A1 | 6/2015 | Marjanovic et al. |
| 2015/0166396 | A1 | 6/2015 | Marjanovic et al. |
| 2016/0035587 | A1* | 2/2016 | Keech ................. H01L 21/4803 |
| | | | 216/90 |

FOREIGN PATENT DOCUMENTS

| | | |
|---|---|---|
| CN | 202290529 U | 7/2012 |
| CN | 104237332 A | 12/2014 |
| CN | 106929857 A | 7/2017 |
| CN | 107796912 A | 3/2018 |
| EP | 268633 B1 | 2/1992 |
| JP | 11-194120 A | 7/1999 |
| JP | 2001271180 A | 10/2001 |
| JP | 2002100604 | 4/2002 |
| JP | 2002198344 A | 7/2002 |
| JP | 2003305419 A | 10/2003 |
| JP | 2004249212 A | 9/2004 |
| JP | 2007044662 A | 2/2007 |
| JP | 2007194348 A | 8/2007 |
| KR | 1120707 B1 | 3/2012 |
| WO | 99/12026 A1 | 3/1999 |
| WO | 2013/181123 A1 | 12/2013 |

OTHER PUBLICATIONS http://www.ucl.ac.uk/medphys/staff/people/bcox/USlecturenotes_Jan2013.pdf, "Acoustics for Ultrasound Imaging" by Ben Cox, Jan. 2013.

Chinese Patent Application No. 201580041853.2; English Tranlsation of the First Office Action dated Aug. 26, 2019; China Patent Office; 11 Pgs.

Japanese Patent Application No. 2017504803; Machine Translation of the Office Action dated Aug. 14, 2019; Japan Patent Office; 4 Pgs.

Henbge et al.; "Chemical Analysis of Acidic Silicon Etch Solutions I. Titrimetric Determination of HNO3, HF, and H2SiF6"; Talanta 73 (2007), pp. 220-226.

* cited by examiner

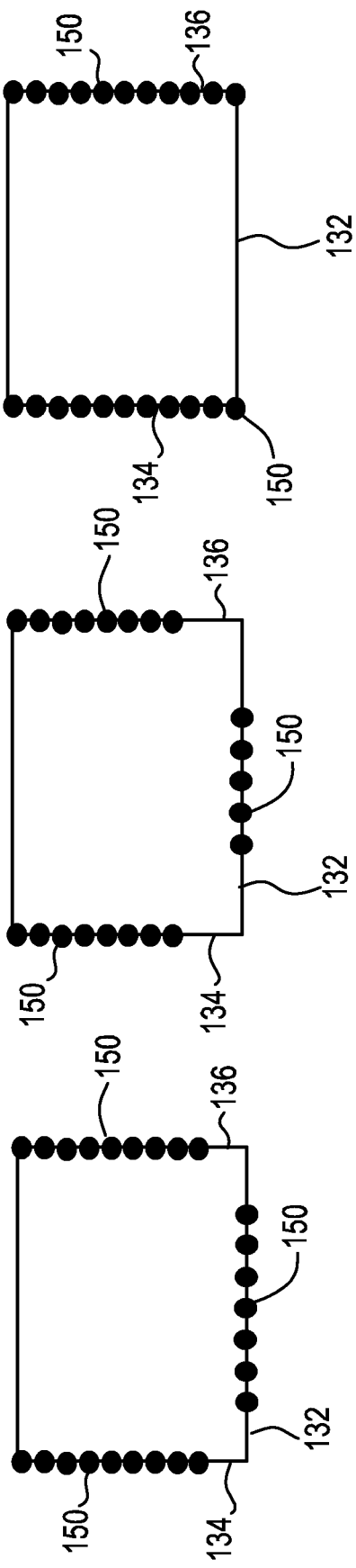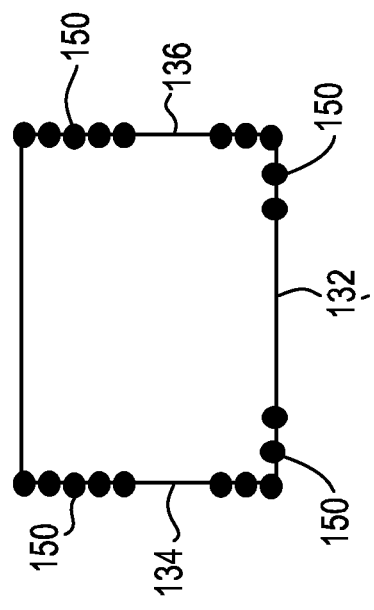

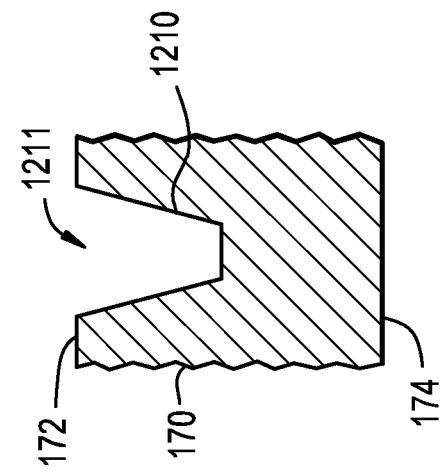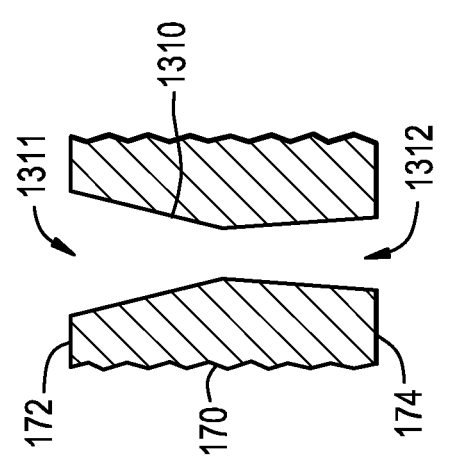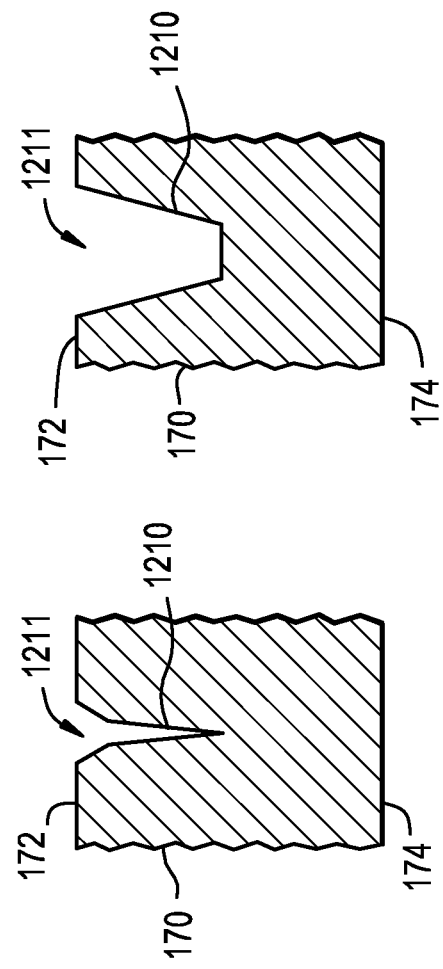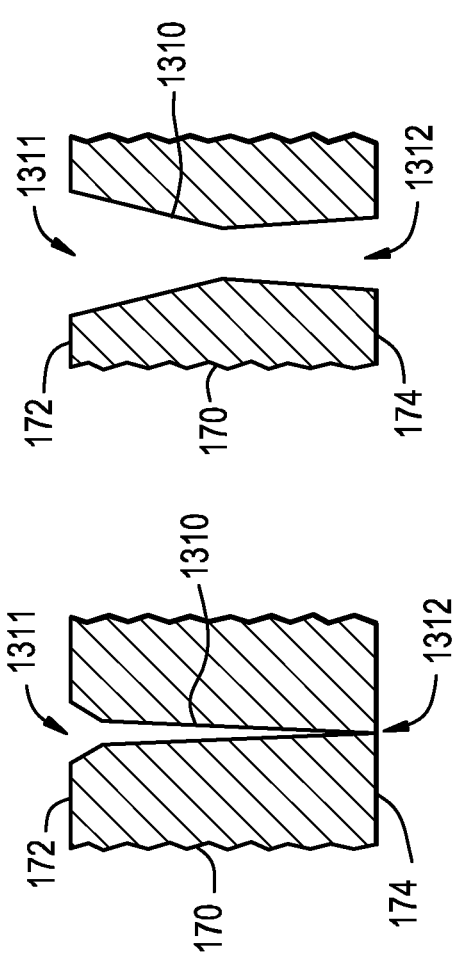

ULTRASONIC TANK AND METHODS FOR UNIFORM GLASS SUBSTRATE ETCHING

CROSS-REFERENCE TO RELATED APPLICATIONS

This application claims the benefit of priority under 35 U.S.C. § 119 of U.S. Provisional Application Ser. No. 62/030839 filed on Jul. 30, 2014 the content of which is relied upon and incorporated herein by reference in its entirety.

BACKGROUND

Field

The present disclosure generally relates to ultrasonic tank designs that provide uniform glass substrate etching and methods for using such ultrasonic tanks to uniformly etch glass substrates.

Technical Background

An interposer can be used to route electrical signals between silicon microchips and organic substrates, to fan out electrical connections between dense-pitch chips and wider-pitch layers underneath, or to connect multiple silicon chips in two or three dimensional packaging architectures. Glass is an attractive option for these types of interposers because it can have a coefficient of thermal expansion (CTE) close to that of a silicon chip, it is an electrical insulator, it can be made with very low surface roughness that makes application of dense electrical traces feasible, and it has a high modulus (stiffness) that makes handling it in large sizes easier than organic options such as fiber-reinforced polymers. And, glass can be formed in large thin sheets that do not require post-processing steps such as thinning or polishing to achieve the required dimensions or surface quality. A problem associated with using glass as an interposer is forming via holes of a desired dimension, of sufficient quality and with desired internal via profile.

SUMMARY

One successful method of making via holes in a glass substrate, known as the laser damage and etch method, forms small pilot holes in the glass substrate with a laser and then etches the glass substrate to enlarge the hole to desired dimensions. Ultrasonic etching is one option for etching the glass as the ultrasonic energy agitates an etching solution causing it to flow into the pin holes, thereby expediting and improving the enlargement of the holes to the desired dimensions. Ultrasonic etching is not without its own problems; if the ultrasonic power is not uniform throughout a working area of an ultrasonic tank then the glass substrate is not uniformly etched. In fact, there can be hot spots of ultrasonic energy in the working area that can damage the glass and cold spots of ultrasonic energy where the etching is not as efficient. The present disclosure describes ultrasonic tank designs detailing configurations of ultrasonic transducers that result in more uniform glass substrate etching.

In some embodiments, an ultrasonic tank includes a container, an etching solution tank having a working area disposed within the container, and a plurality of ultrasonic transducers arranged about a perimeter of the etching solution tank in a configuration that provides a standard deviation of ultrasonic power within the working area of less than about 0.35.

In some embodiments, a glass etching system includes a glass substrate, an etching solution supply, and an ultrasonic tank. The ultrasonic tank includes a container, an etching solution tank disposed within the container wherein the etching solution tank having a working area for etching the glass substrate, and a plurality of ultrasonic transducers arranged about a perimeter of the etching solution tank in a configuration that provides a standard deviation of ultrasonic power within the working area of less than about 0.35.

In some embodiments, a method for etching a glass substrate include placing the glass substrate in an ultrasonic tank, etching the glass substrate for an etching duration, and applying ultrasonic energy to the glass substrate through ultrasonic transducers during a portion of the etching duration. The ultrasonic tank includes a container, an etching solution tank having a working area disposed within the container, and a plurality of ultrasonic transducers arranged about a perimeter of the etching solution tank in a configuration that provides a standard deviation of ultrasonic power within the working area of less than about 0.35.

In some embodiments, the working area of the ultrasonic tank has a center, a relative ultrasonic power at the center is 1, and the relative ultrasonic power at each point in the working area is in a range from about 0.8 to about 1.8.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 8 depicts a third exemplary embodiment for the ultrasonic transducer configuration of the ultrasonic tank resulting in uniform etching;

FIG. 9 depicts a fourth exemplary embodiment for the ultrasonic transducer configuration of the ultrasonic tank resulting in uniform etching;

FIG. 10 depicts a fifth exemplary embodiment for the ultrasonic transducer configuration of the ultrasonic tank resulting in uniform etching;

FIG. 11 depicts a sixth exemplary embodiment for the ultrasonic transducer configuration of the ultrasonic tank resulting in uniform etching;

FIG. 12A schematically depicts a cross section of a glass substrate with a blind via pilot hole, according to one or more embodiments shown and described herein;

FIG. 12B schematically depicts a cross section of the glass substrate of FIG. 11A after being etched, according to one or more embodiments shown and described herein;

FIG. 13A schematically depicts a cross section of a glass substrate with a through via pilot hole, according to one or more embodiments shown and described herein;

FIG. 13B schematically depicts a cross section of the glass substrate of FIG. 12A after being etched, according to one or more embodiments shown and described herein;

DETAILED DESCRIPTION

Figure 1:
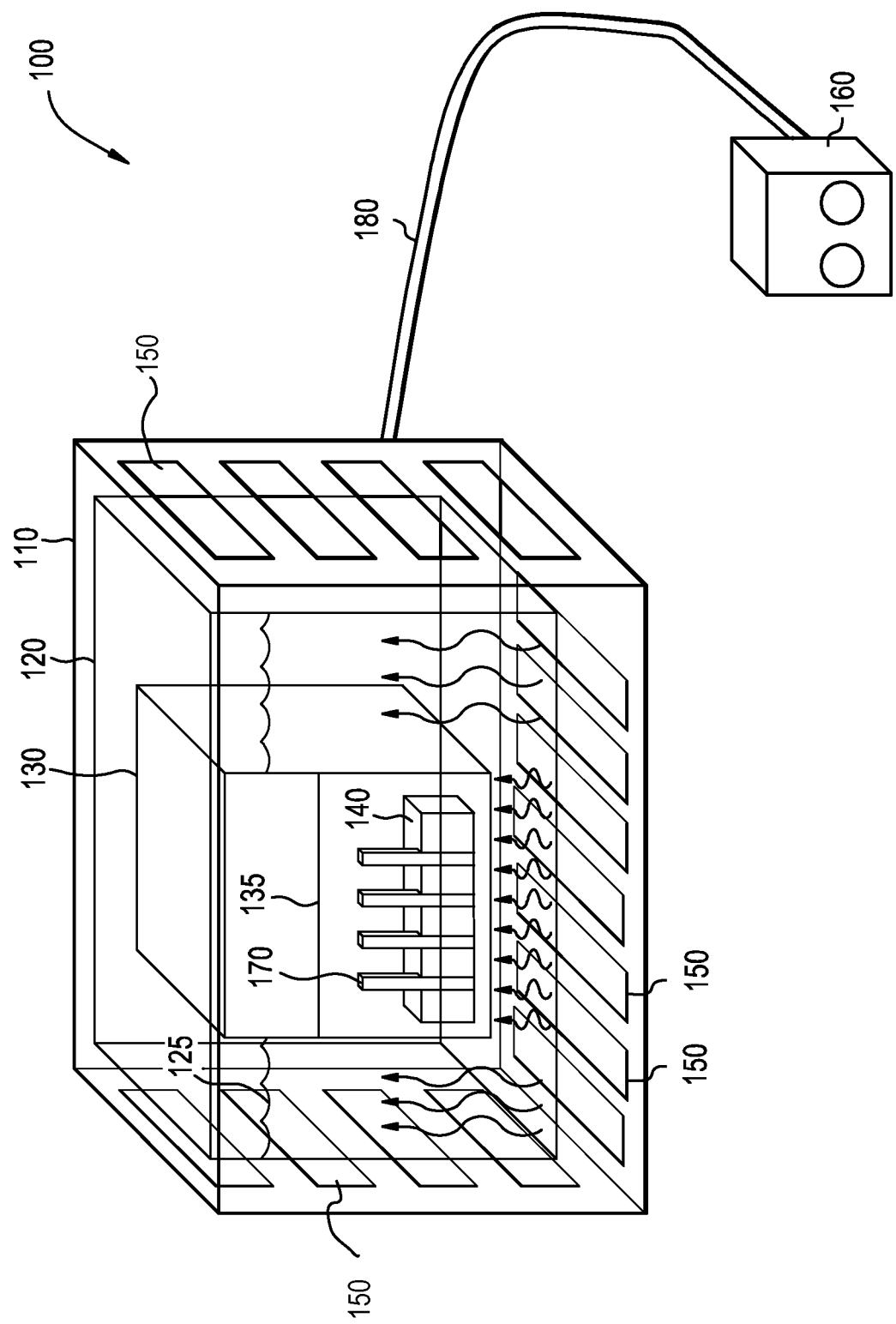
FIG. 1 schematically depicts an ultrasonic tank for uniformly etching a glass substrate.

Reference will now be made in detail to the present preferred embodiment(s), an examples of which is/are illustrated in the accompanying drawings. Whenever possible, the same reference numerals will be used throughout the drawings to refer to the same or like parts.

In some embodiments, the ultrasonic etching system for uniform etching of a glass substrate can include an ultrasonic etching tank, a supply of glass substrates to be etched, and a supply of etching solution. FIG. 1 schematically depicts an exemplary ultrasonic tank 100, which can include an outer container 110, a water tank 120, an etching solution tank 130, a sample holder 140, ultrasonic transducers 150, and an ultrasonic generator 160. In some embodiments, etching solution tank 130 is disposed within water tank 120 and water tank 120 is disposed within outer container 110. In some embodiments, there is no water tank Ultrasonic transducers 150 can be disposed within outer container 110 and interface with water tank 120, such that ultrasonic energy may be imparted to water 125 contained within water tank 120, which is then imparted to an etching solution 135 contained within etching solution tank 130, and ultimately imparted to one or more glass substrate(s) 170 supported by sample holder 140 in etching solution tank 130. In embodiments without a water tank, ultrasonic transducers 150 interface directly with etching solution tank 130 to impart ultrasonic energy to etching solution 135. The arrangement of ultrasonic transducers 150 in FIG. 1 (on the bottom and sides of the water tank) is merely exemplary; it should be understood that ultrasonic transducers 150 can be arranged in any position and orientation relative to the etching solution tank 130, such as on the sides of etching solution tank 130 and/or on the bottom of the etching solution tank 130, as will be described in further detail below. The ultrasonic energy applied to glass substrate(s) 170 while being etched by etching solution 135 in the etching solution tank 130 enhances the etching of the glass substrate(s) 170 and facilitates the formation of vias with desirable characteristics, as will be described in further detail below.

Outer container 110 can be the outer shell for the ultrasonic etching tank and can be made out of material that does not transmit the ultrasonic energy generated by ultrasonic transducers 150 including, but not limited to high frequency resistant metal alloys, such as Alloy 400 and Alloy C-276 (NiDI Technical Series No 10 074).

Water tank 120 can be formed from a material that transmits ultrasonic energy from ultrasonic transducers 150 to water 125, including, but not limited to stainless steel 304. Water 125 can be filled to a level sufficient to ensure that ultrasonic energy produced by ultrasonic transducers 150 is transferred to glass substrate(s) 170 immersed within etching solution tank 130. In some embodiments, water 125 is deionized water, which can include a few millimeters of detergent to reduce surface tension. However, it should be understood that in other embodiments, water 125 can be a type of water other than deionized water and/or may not include detergent. Furthermore, it should be understood that a liquid other than water can be utilized to transfer the ultrasonic energy from ultrasonic transducers 150 to etching solution 135 within etching solution tank 130. Some embodiments may not include water tank 120, such as in embodiments in which ultrasonic transducers 150 directly agitate etching solution 135 in etching solution tank 130.

Etching solution tank 130 can be formed from an acid-resistant material, such as a plastic, like polypropylene or high density polyethylene. Etching solution tank 130 includes etching solution 135, provided from the supply of etching solution, filled to a level sufficient to ensure that ultrasonic energy produced by the ultrasonic transducers 150 is transferred to glass substrate(s) 170. In some embodiments, etching solution 135 is an aqueous solution including deionized water, a primary acid, and a secondary acid. The primary acid can be hydrofluoric acid and the secondary acid can be nitric acid, hydrochloric acid, or sulfuric acid. In some embodiments, etching solution 135 may include a primary acid other than hydrofluoric acid and/or a secondary acid other than nitric acid, hydrochloric acid, or sulfuric acid. Furthermore, in some embodiments, etching solution 135 can only include a primary acid. In some embodiments, the etching solution 135 may include 20% by volume of a primary acid (e.g., hydrofluoric acid), 10% by volume of a secondary acid (e.g., nitric acid), and 70% by volume of deionized water. In other embodiments, etching solution 135 can include different proportions of the primary acid, the secondary acid, and deionized water. In some embodiments, etching solution 135 can include a surfactant, such as 5-10 mL of a commercially available surfactant.

Ultrasonic generator 160 is electrically connected to ultrasonic transducers 150 via an electrical cable 180. Ultrasonic generator 160 causes ultrasonic transducers 150 to produce ultrasonic energy at one or more frequencies. Ultrasonic transducers 150 can produce ultrasonic energy at a variety of frequencies. In some embodiments, the ultrasonic energy has a frequency between 40 kHz and 192 kHz. In some embodiments, the ultrasonic energy has a frequency between 80 kHz and 132 kHz.

As discussed above, ultrasonic power distribution is not always uniform throughout etching solution 135 in etching solution tank 130—there are "hot spots" (areas where ultrasonic energy is higher than average, and glass damage or etching may occur faster than in other areas and "cold spots" (areas where ultrasonic energy is lower than average, and etching may occur slower than in other areas). The presence of hot spots and cold spots are undesirable because it results in non-uniform etching of glass substrate(s) 170. Areas of glass substrate(s) 170 corresponding to hot spots in etching solution tank 130 can become damaged (e.g., cavitation, cracking, and/or marking), while areas of glass substrate(s) 170 corresponding to cold spots in etching solution tank 130 can be subject to insufficient etching. Uniform etching of glass substrate(s) 170 can be achieved through appropriate arrangement of ultrasonic transducers 150 about the perimeter of etching solution tank 130.

In some embodiments, uniform etching of glass substrate(s) 170 can be achieved when ultrasonic transducers 150 are arranged in a configuration that provides a standard deviation of ultrasonic power in a working area of etching solution tank 130 of less than about 0.35, less than about 0.3, or less than about 0.25. The working area of an etching solution tank as defined herein is the interior area formed by an imaginary boundary that is spaced inward from the perimeter of a longitudinal cross-section of the etching solution tank by 10%. For example, if the etching solution tank has a square cross-section, then the working area would be defined by the 0.10 and 0.90 fractional width and height of the etching solution tank. It is to be understood that a square cross-section is merely exemplary and the longitudinal cross-section of the etching solution tank can be other shapes including, but not limited to, rectangular, trapezoidal, hexagonal, and octagonal.

The standard deviation of ultrasonic power in the working area can be determined by measuring the ultrasonic power at a series of equidistant data points within the working area and then determining the standard deviation using the formula:

$$\sigma = \sqrt{\frac{\sum_{i=1}^{n}(x_i - \mu)^2}{n-1}}$$

$$\text{where } \mu = \frac{1}{N}\sum_{i=1}^{N} x_i.$$

where:
σ=the standard deviation;
N=the number of data points;
$x_i$=the individual data points; and
μ=the mean of the individual data points.

In some embodiments, in combination with or separate from the standard deviation ranges list above, uniform etching of glass substrate(s) 170 can be achieved when ultrasonic transducers 150 are arranged in a configuration that provides a relative ultrasonic power for each point in the working area of etching solution tank 130 in a range from about 0.8 to about 1.8, from about 0.8 to about 1.7, from about 0.8 to about 1.6, from about 0.9 to about 1.8, from about 0.9 to about 1.7, from about 0.9 to about 1.6, from about 1 to about 1.8, from about 1 to about 1.7, from about 1 to about 1.6.

The ultrasonic power can be modeled based on the principle that ultrasonic power decreases with a "$1/d^2$" fall off, wherein d is the distance from the ultrasonic transducer. If a configuration contains two or more transducers, then the power from each transducer can be added together taking into account any differences in the power of each transducer. The relative ultrasonic power for each point in the working area can be determined by dividing the ultrasonic power at each point by the ultrasonic power at the center of the working area. As a result, the relative ultrasonic power is 1 at the center of the working area.

Figure 2:
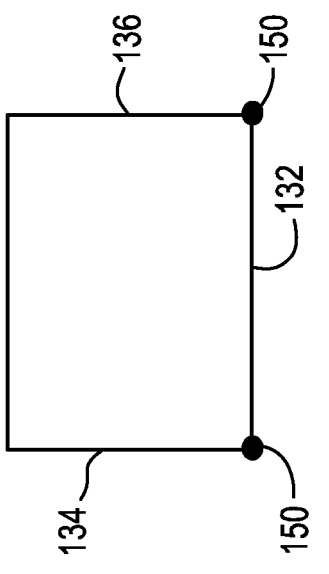
FIG. 2 depicts a first known ultrasonic transducer configuration for an ultrasonic tank that results in non-uniform etching.
Figure 3:
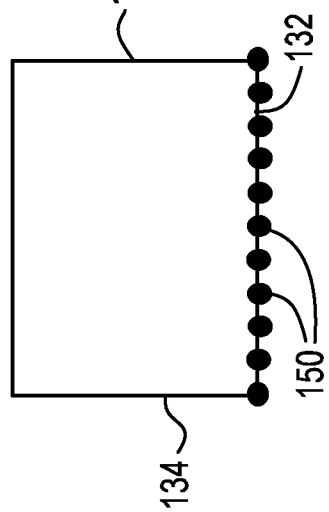
FIG. 3 depicts a second known ultrasonic transducer configuration for an ultrasonic tank that results in non-uniform etching.
Figure 4:
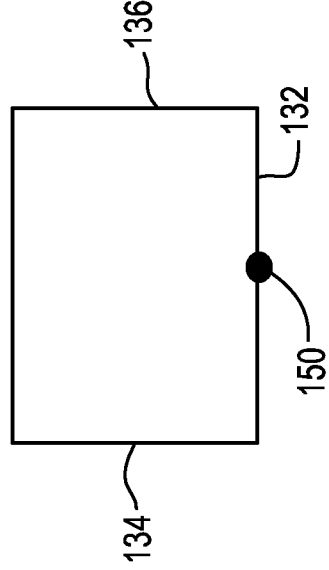
FIG. 4 depicts a third known ultrasonic transducer configuration for an ultrasonic tank that results in non-uniform etching.
Figure 5:
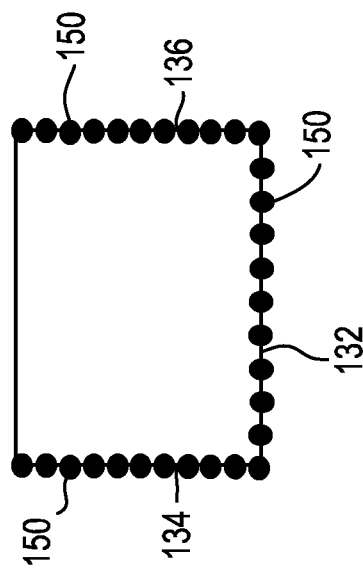
FIG. 5 depicts a fourth known ultrasonic transducer configuration for an ultrasonic tank that results in non-uniform etching.
Figure 6:
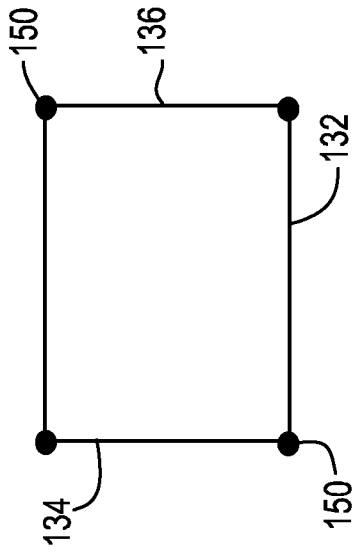
FIG. 6 depicts a first exemplary embodiment for the ultrasonic transducer configuration of the ultrasonic tank resulting in uniform etching.
Figure 7:
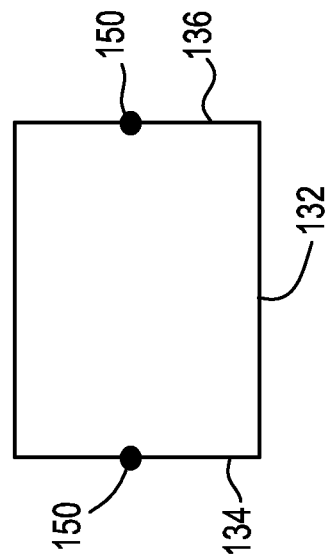
FIG. 7 depicts a second exemplary embodiment for the ultrasonic transducer configuration of the ultrasonic tank resulting in uniform etching.

FIGS. 2-11 illustrate longitudinal cross-sectional views of etching solution tank 130 with various ultrasonic transducer configurations. In FIGS. 2-11 etching solution tank 130 is quadrilateral, a bottom surface and four side surfaces extending vertically from the bottom surface, wherein each of the four side surfaces comprise two vertical edges and two horizontal edges and the four side surfaces comprise two pairs of opposing surfaces. The longitudinal cross-sectional of views FIGS. 2-11 show bottom surface 132 and one pair of opposing side surfaces 134, 136 of etching solution tank 130. Ultrasonic transducers 150 can be a linear array of transducers that is arranged to extend along a length or width of a surface 132, 134, or 136 of etching solution tank 130. FIGS. 2-5 are examples of known ultrasonic transducer configurations that result in non-uniform etching as discussed in the Example below, whereas FIGS. 6-11 are exemplary configurations expected to result in uniform etching of glass substrate(s) 170 as discussed in the Example below. FIG. 2 illustrates a configuration with a single ultrasonic transducer 150 extending along the length of bottom surface 132 at approximately the center width of bottom surface 132. FIG. 3 illustrates a configuration with ultrasonic transducers continuously spaced along the width of bottom surface 132 and extending along the length of bottom surface 132. FIG. 4 illustrates a configuration with ultrasonic transducers 150 extending along the length of the bottom corners. FIG. 5 illustrates a configuration with each side surface 134, 136 having a single ultrasonic transducer 150 extending along its length at approximately the center height of side surfaces 134, 136. FIG. 6 illustrates a configuration with ultrasonic transducers 150 extending along the length of the bottom two corners and the top two corners (i.e., along the length of the horizontal edges of side surfaces 134, 136). FIG. 7 illustrates a configuration with ultrasonic transducers 150 continuously spaced along the height of side surfaces 134, 136 and extending along the length of side surfaces 134, 136, as well as continuously spaced along the width of bottom surface 132 and extending along the length of bottom surface 132. FIG. 8 illustrates a configuration with ultrasonic transducers 150 continuously spaced along the upper 80% of the height of side surfaces 134, 136 and extending along the length of side surfaces 134, 136, as well as continuously spaced along the middle 60% of the width of bottom surface 132 and extending along the length of bottom surface 132. FIG. 9 illustrates a configuration with ultrasonic transducers 150 continuously spaced along the upper 70% of the height of side surfaces 134, 136 and extending along the length of side surfaces 134, 136, as well as continuously spaced along the middle 40% of the width of bottom surface 132 and extending along the length of bottom surface 132. FIG. 10 illustrates a configuration with ultrasonic transducers 150 continuously spaced along the height of side surfaces 134, 136 and extending along the length of side surfaces 134, 136. FIG. 11 illustrates a configuration with ultrasonic transducers 150 continuously spaced along the upper 40% of the height of each side surface 134, 136 and extending along the length of side surfaces 134, 136; continuously spaced along the lower 20% of the height of each side surface 134, 136 and extending along the length of side surfaces 134, 136; continuously spaced along the left 20% of the width of bottom surface 132 and extending along the length of bottom surface 132; and continuously spaced along the right 20% of the width of bottom surface 132 and extending along the length of bottom surface 132.

In some embodiments, a longitudinal cross-section of the etching solution tank 30 has a width to height aspect ratio of 1:1. However, in some embodiments alternative aspect ratios can also be used, including, but not limited to 2:1, 1.5:1, 1:1.5, or 1:2. A total standard deviation can be calculated to determine if a given configuration of ultrasonic transducers 150 will result in uniform etching of glass substrate(s) 170 for different aspect ratios. The total standard deviation can be calculated by taking the standard deviation of the standard deviations for an aspect ratio of 1:1, 1:1.5, 1:2, 1.5:1, and 2:1. Thus, in some embodiments, uniform etching of glass substrate(s) 170 can be achieved when ultrasonic transducers 150 are arranged in a configuration that provides a total standard deviation of ultrasonic power in a working area of etching solution tank 130 of less than about 0.08, less than about 0.07, or less than about 0.06, less than about 0.05, or less than about 0.04. In some embodiments, the ultrasonic transducer configuration results in any combination of the ranges for relative ultrasonic power, standard deviation, and total standard deviation listed above.

As discussed above, the system can include a supply of glass substrates that are to be etched in ultrasonic tank 100. The glass substrates can be formed from various glass compositions including, without limitation, borosilicate glasses, aluminosilicate glasses, aluminoborosilicate, and soda lime glasses. Further, the glass substrates can be strengthened (e.g., by an ion exchange process) or non-strengthened. Exemplary glass substrates can include, but are not limited to, Corning EAGLE XG® glass, and chemically strengthened or non-strengthened Corning Gorilla® glass.

In some embodiments, after the etching process the glass substrates can have one or more through vias or blind vias. As used herein, the term "through via" means a hole in a glass substrate that extends entirely through an entire thickness of the glass substrate. As used herein, the term "blind via" means an opening in a glass substrate that extends from a surface of the glass substrate through a portion of a thickness of the glass substrate to a depth, but that does not extend all the way through the thickness of the glass substrate. In some embodiments, one of more of the glass substrates in the supply has one or more pilot holes which are turned into blind vias or through vias during the etching process. In some embodiments, the pilot holes are formed with a laser using a laser drilling technique, such as but not limited to, laser ablation, trepanning, percussion drilling, and the like. In some embodiments, the laser source can be a solid state ultraviolet laser (such as a Nd:YAG laser) emitting a pulsed laser beam having a wavelength of 355 nm. However, it should be understood that in other embodiments laser sources with other wavelengths may be used to laser drill glass substrate(s) 170. Other exemplary processes and systems for forming pin holes in glass substrate(s) 170 are described in U.S. Pub. No. 2013/0247615, and U.S. Application No. 61/917,179 to which U.S. application Ser. No. 14/535,754, published as U.S. Pub. No. 2015-0166395 and U.S. application Ser. No. 14/535,800, published as U.S. Pub. No. 2015-0166396 claims the benefit, each of which are hereby incorporated by reference its entirety.

A method for forming a blind via in a glass substrate by ultrasonic-enhanced etching will now be described with reference to FIGS. 12A-12B. Referring now to FIG. 12A, a glass substrate 170 taken from the supply of glass substrates can be placed in etching solution tank 130 and submerged within etching solution 135. Glass substrate 170 can have a pilot hole for the blind via 1210 laser drilled through a portion of the thickness of the glass substrate 170. The pilot hole extends through glass substrate 170 from an incident opening 1211 of an incident surface 172 into glass substrate 170. The pilot hole for blind via 1210 does not extend all the way through the thickness of glass substrate 170.

Ultrasonic energy is applied by the ultrasonic transducers 150 while the glass substrate 170 is being etched. The glass substrate 170 is etched with the etching solution for an etching duration to increase a diameter of incident opening 1211 of blind via 1210 and the diameter along the entire depth of blind via 1210, as depicted in FIG. 12B.

A method for forming a through via in a glass substrate by ultrasonic-enhanced etching will now be described with reference to FIGS. 13A-13B. Referring now to FIG. 13A, a glass substrate 170 taken from the supply of glass substrates can be placed in etching solution tank 130 and submerged within etching solution 135. Glass substrate 170 can have a pilot hole for the through via 1310 laser drilled through a portion of the thickness of the glass substrate 170. The pilot hole extends through glass substrate 170 from an incident opening 1311 of an incident surface 172 through the thickness of glass substrate 170 to an exit opening 1312 of exit surface 174. A diameter of incident opening 1311 can be larger than the diameter of exit opening 1312.

Ultrasonic energy is applied by the ultrasonic transducers 150 while the glass substrate 170 is being etched. The glass substrate 170 is etched with the etching solution for an etching duration to increase a diameter of incident opening 1311 of blind via 1310 and the diameter along the entire depth of blind via 1310, as depicted in FIG. 13B.

In some embodiments, the ultrasonic energy applied to the glass substrate 170 during at least a portion of the etching duration described above with reference to FIGS. 12A-12B and 13A-13B has a frequency in a range from 40 kHz to 192 kHz or from 80 kHz to 132 kHz. Application of an ultrasonic frequency in the 40 kHz to 192 kHz range or 80 kHz to 132 kHz during etching facilitates the etching and dissolving of glass from the walls of the pilot hole, thereby increasing the diameter of incident opening 1211 of the blind via 1210 to a desired diameter and/or the diameter of incident opening 1311 and exit opening 1312 to a desired diameter. The 40 kHz to 192 kHz range or 80 kHz to 132 kHz range of ultrasonic frequency may minimize surface damage to the glass substrate 170, which can occur at lower frequencies of ultrasonic energy. Furthermore, the 40 kHz to 192 kHz or 80 kHz to 132 kHz range of ultrasonic frequency can enable effective etching of the via at an acceptable and relatively constant etch rate. The 80 kHz to 132 kHz range may be more preferable than the broader 40 kHz to 192 kHz range because this range is high enough to prevent surface damage, but low enough to ensure effective etching. However, it should be understood that in other embodiments, the ultrasonic frequency range may be other than 40 kHz to 192 kHz or 80 kHz to 132 kHz. Other exemplary processes for ultrasonic etching of glass substrates are described in U.S. Appl. No. 61/871,440 to which U.S. application Ser. No. 14/464,851, published as U.S. Pub. No. 2015-0060402 claims the benefit, and U.S. Application No. 61/917,179 to which U.S. application Ser. No. 14/535,754, published as U.S. Pub. No. 2015-0166395 and U.S. application Ser. No. 14/535,800, published as U.S. Pub. No. 2015-0166396 claims the benefit, each of which is hereby incorporated by reference in its entirety.

EXAMPLE

Various embodiments will be further clarified by the following example.

As discussed above, known ultrasonic transducer configurations have hot spots and cold spots, which result in uneven etching of glass substrates. It is believed that the variation in relative ultrasonic power density throughout the working area of the ultrasonic tank results in the hot spots and cold spots. Nine configurations (configurations 1-9) for ultrasonic transducers about a perimeter of etching solution tank were modeled to determine an ultrasonic power density map. Configurations 1-10 correspond to FIGS. 2-11, respectively, with FIGS. 2-5 representing known ultrasonic configurations. The ultrasonic power density maps for configurations 1-10, are shown in FIGS. 14-23, respectively. The models in FIGS. 14-23 were based on a working area having a width to height aspect ratio of 1:1. The ultrasonic power was calculated based on principle that ultrasonic power decreases with a "$1/d^2$" fall off, wherein d is the distance from the ultrasonic transducer. If a tank configuration contained two or more transducers, then the power from each transducer was linearly added together based on the assumption that the power of each transducer was equal. The total power in the tank was normalized to the power in the center of the working area, such that each configuration has equal power in the center of the working area. Table 1 below lists the relative ultrasonic power range for each configuration based on the 1:1 aspect ratio model and the standard deviation for the ultrasonic power within the working area based on the 1:1 aspect ratio. Table 1 also lists the total standard deviation for each configuration based on calculating the standard deviation of the standard deviations for an aspect ratio of 1:1, 1:1.5, 1:2, 1.5:1, and 2:1.

TABLE 1

Figure 14:
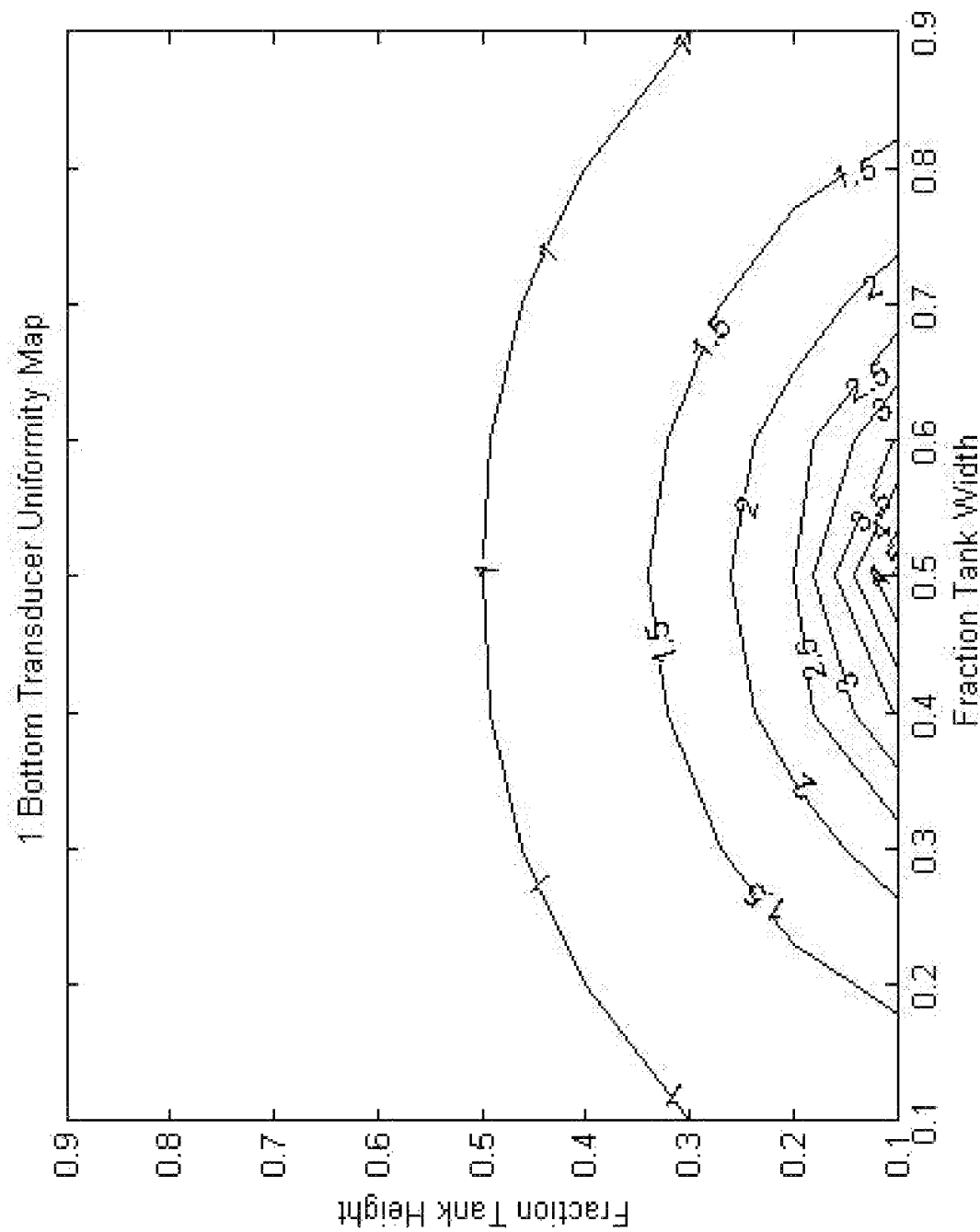
FIG. 14 shows a relative ultrasonic power density map for a working area of an ultrasonic tank having the ultrasonic transducer configuration of FIG. 2.
Figure 15:
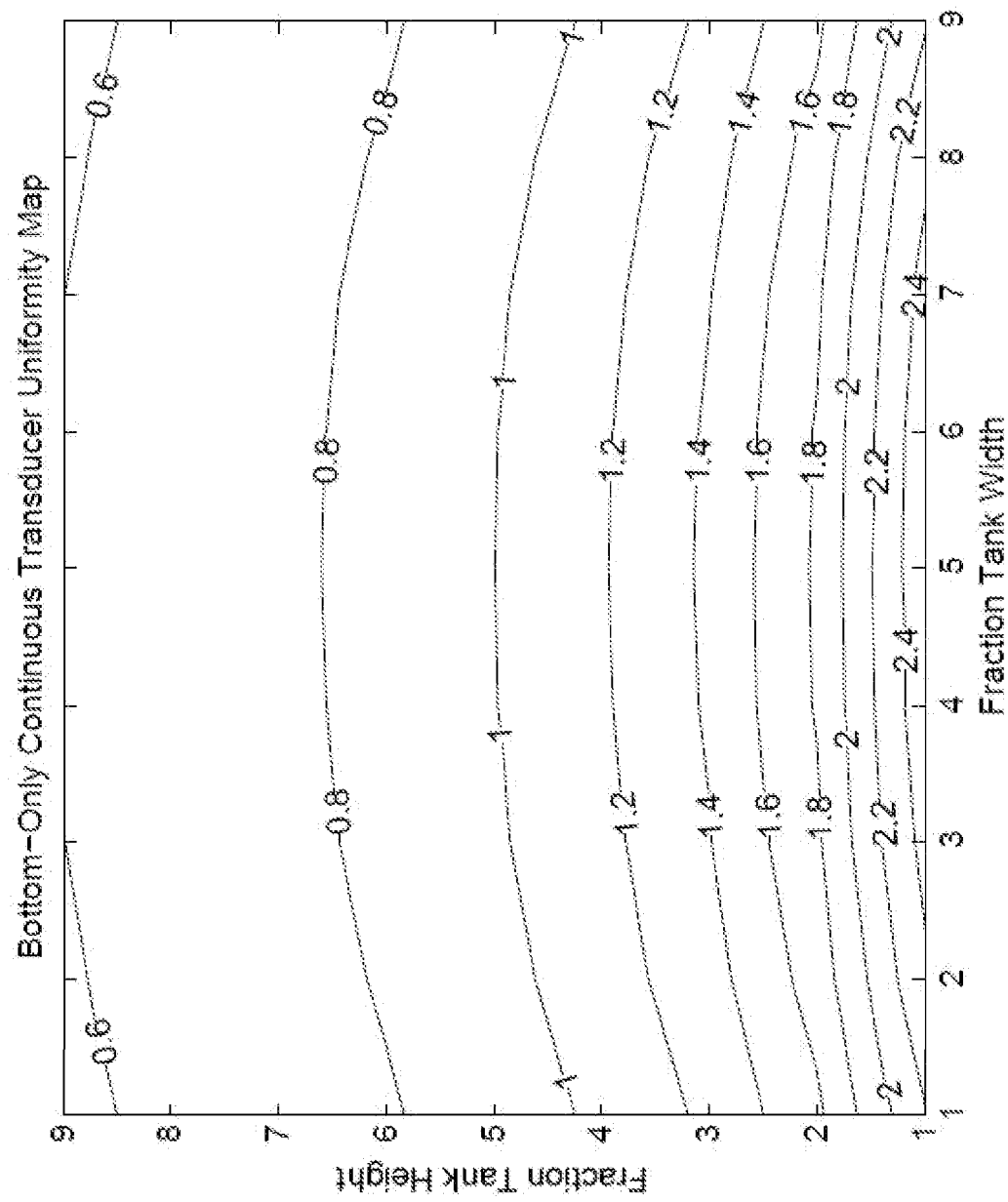
FIG. 15 shows a relative ultrasonic power density map for a working area of an ultrasonic tank having the ultrasonic transducer configuration of FIG. 3.
Figure 16:
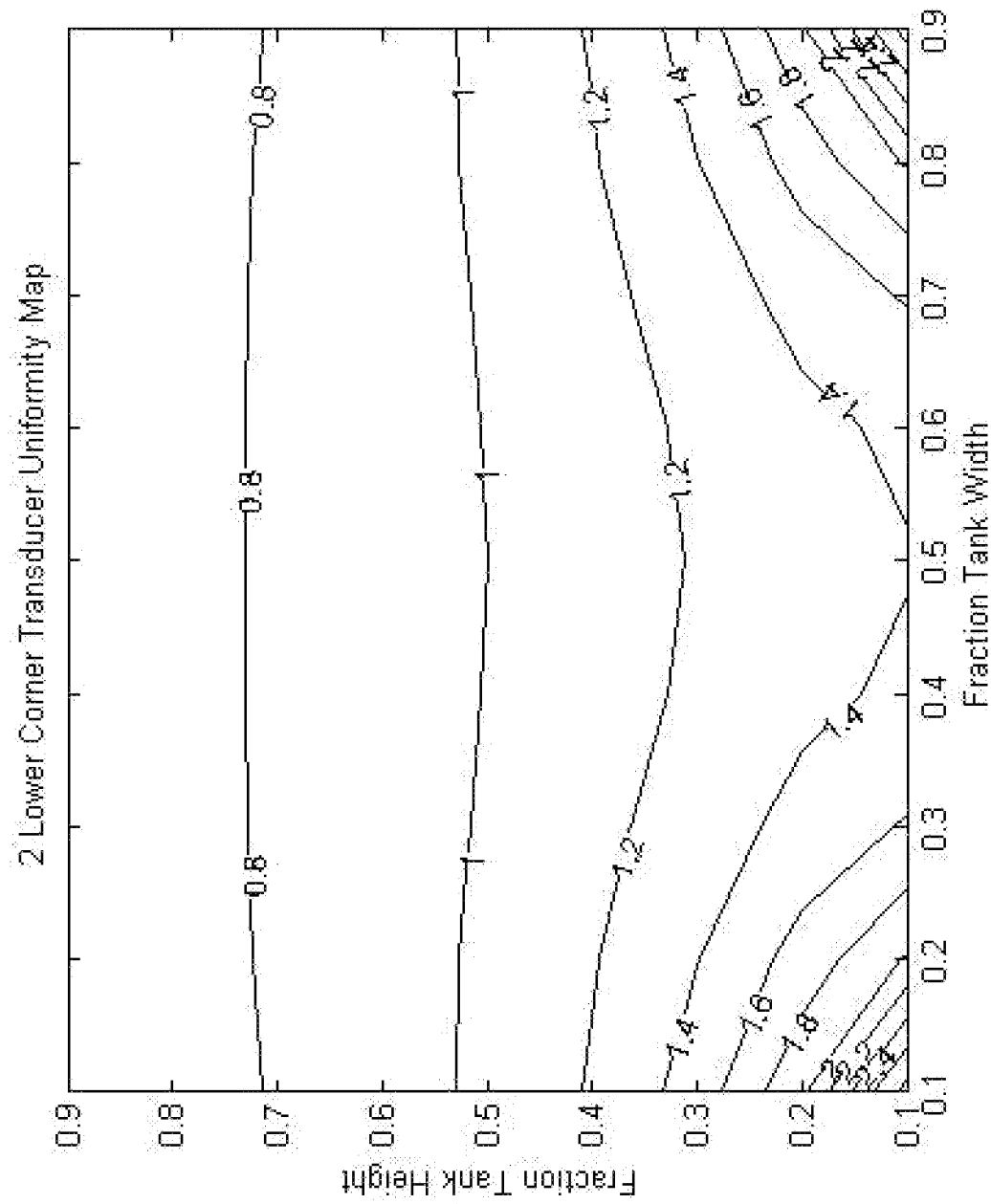
FIG. 16 shows a relative ultrasonic power density map for a working area of an ultrasonic tank having the ultrasonic transducer configuration of FIG. 4.
Figure 17:
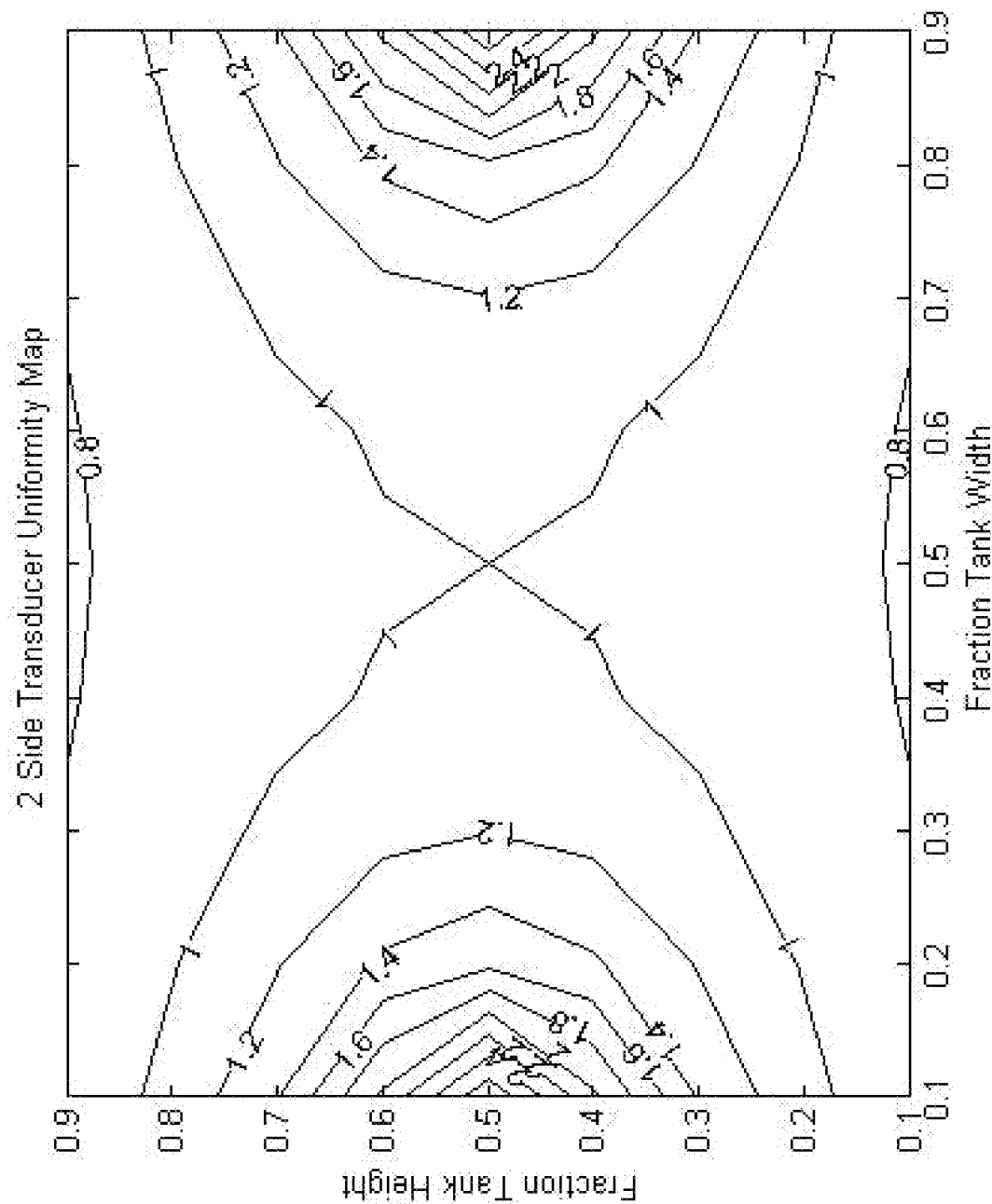
FIG. 17 shows a relative ultrasonic power density map for a working area of an ultrasonic tank having the ultrasonic transducer configuration of FIG. 5.
Figure 18:
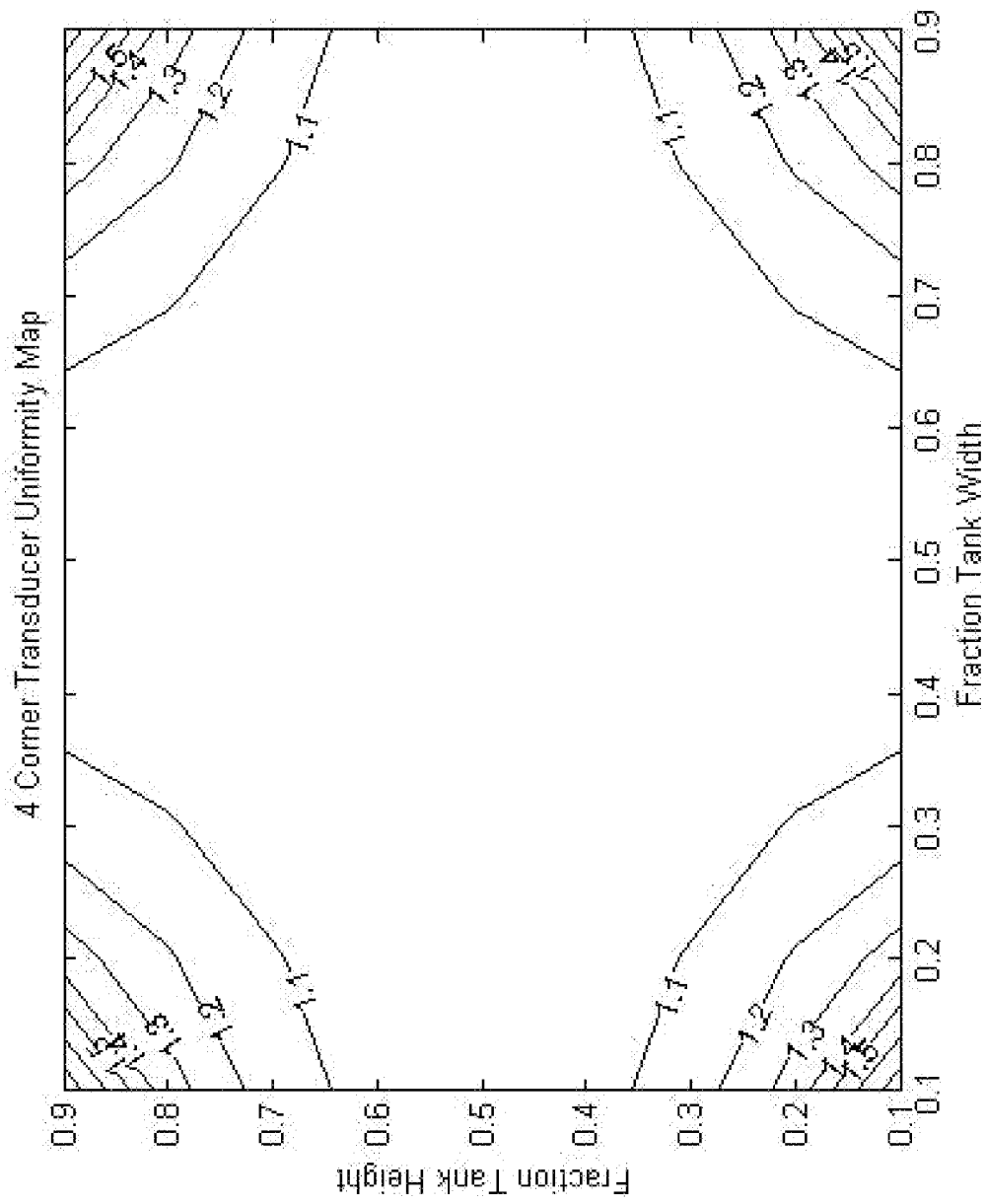
FIG. 18 shows a relative ultrasonic power density map for a working area of an ultrasonic tank having the ultrasonic transducer configuration of FIG. 6.
Figure 19:
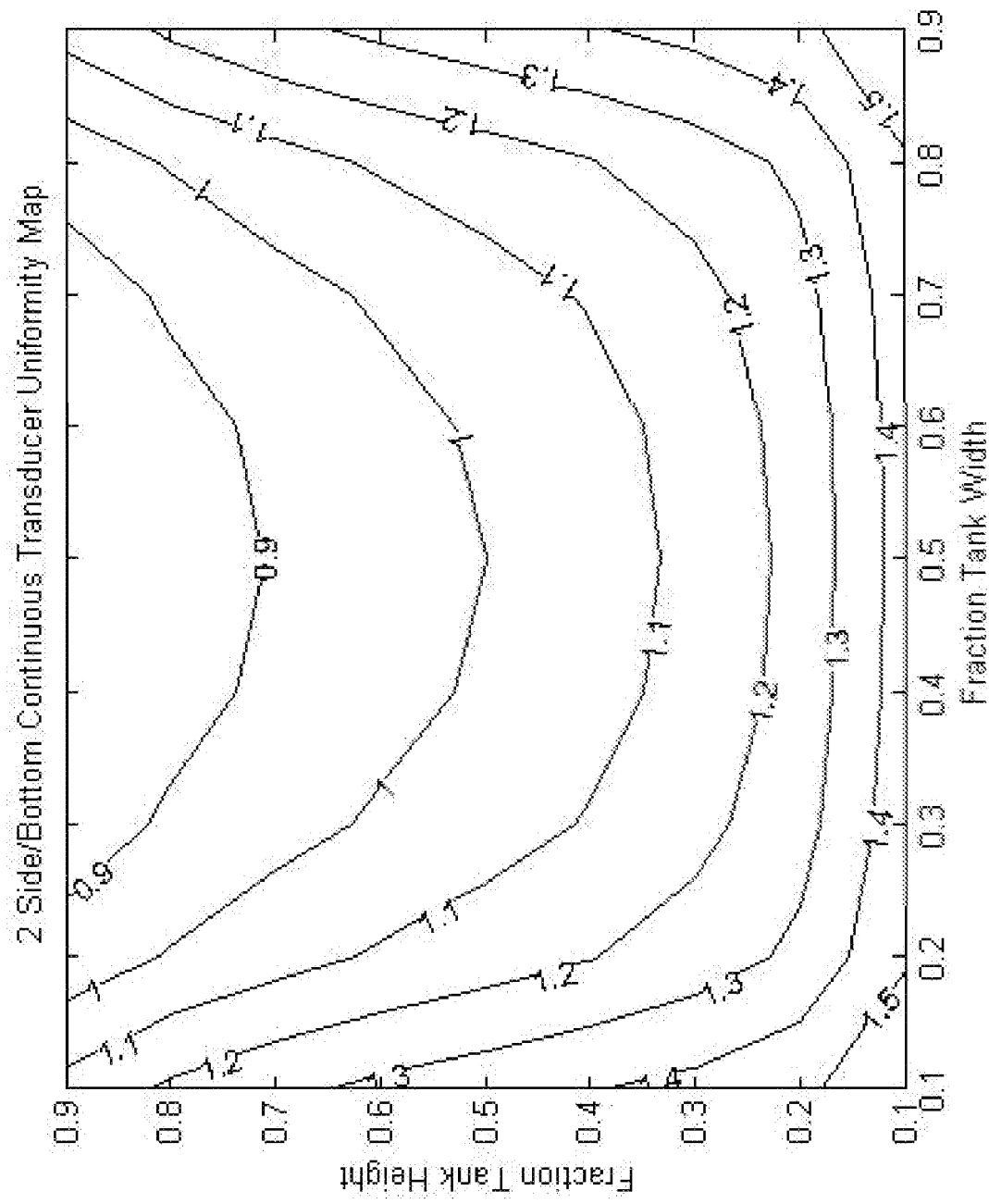
FIG. 19 shows a relative ultrasonic power density map for a working area of an ultrasonic tank having the ultrasonic transducer configuration of FIG. 7.
Figure 20:
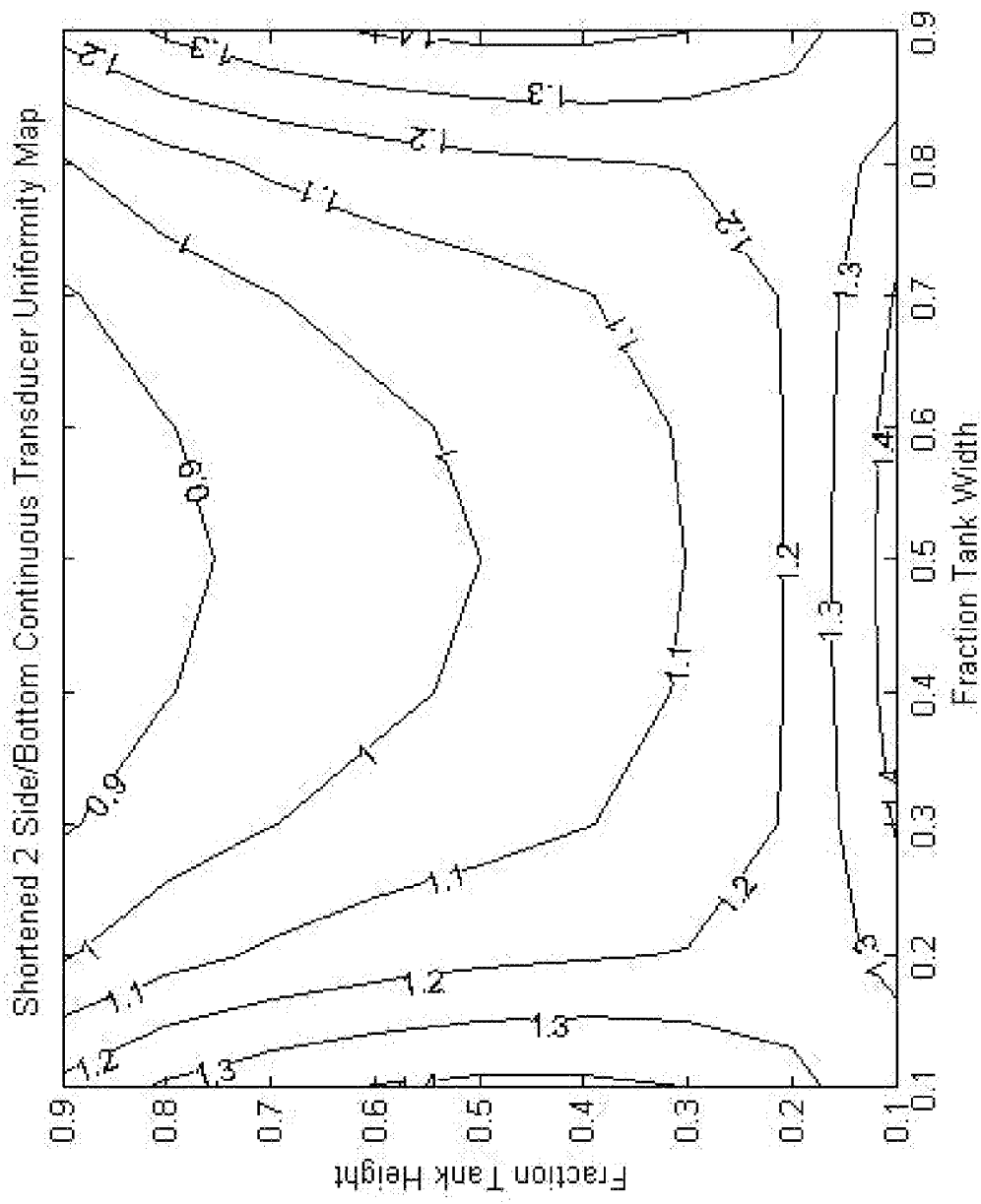
FIG. 20 shows a relative ultrasonic power density map for a working area of an ultrasonic tank having the ultrasonic transducer configuration of FIG. 8.
Figure 21:
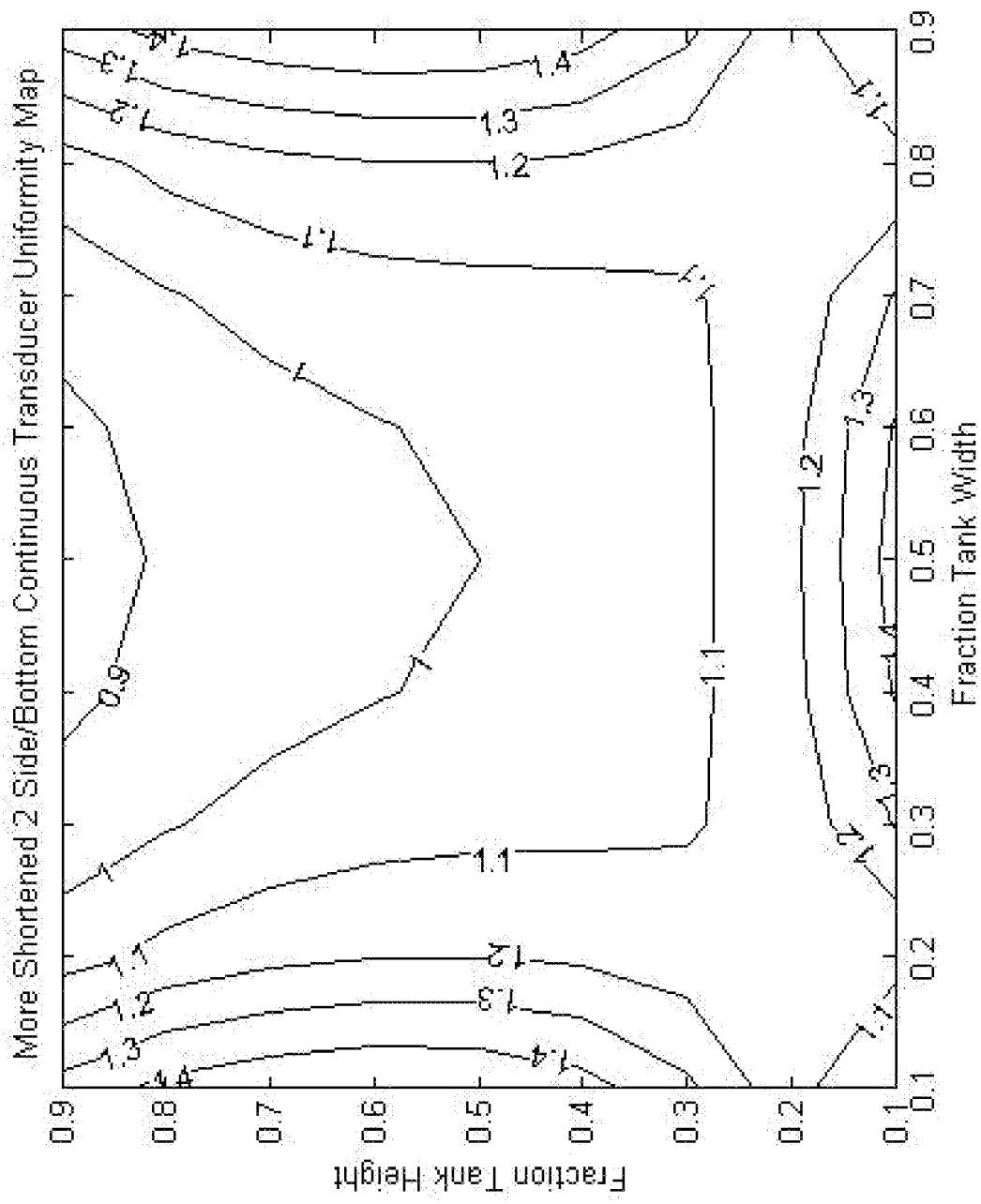
FIG. 21 shows a relative ultrasonic power density map for a working area of an ultrasonic tank having the ultrasonic transducer configuration of FIG. 9.
Figure 22:
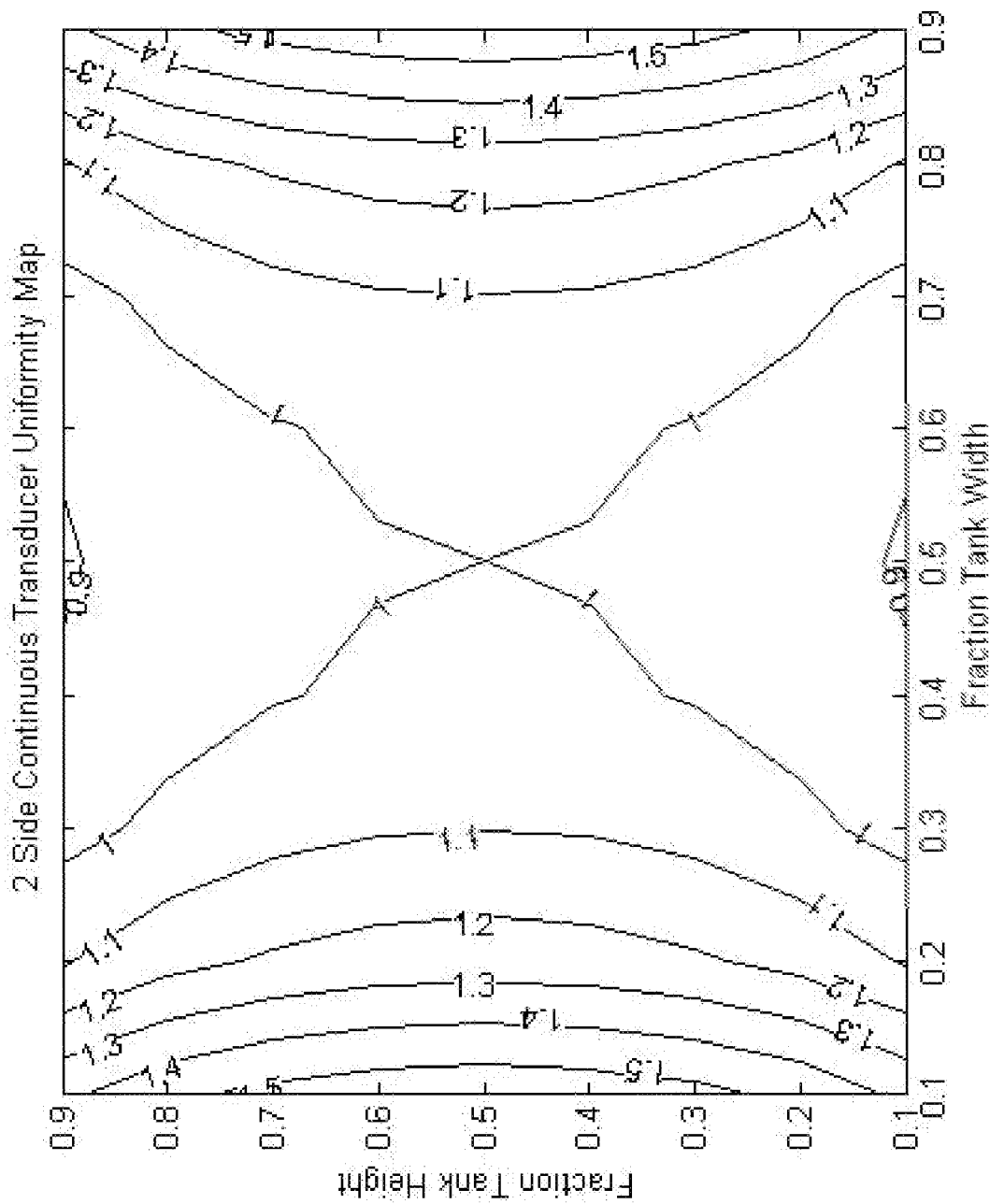
FIG. 22 shows a relative ultrasonic power density map for a working area of an ultrasonic tank having the ultrasonic transducer configuration of FIG. 10.
Figure 23:
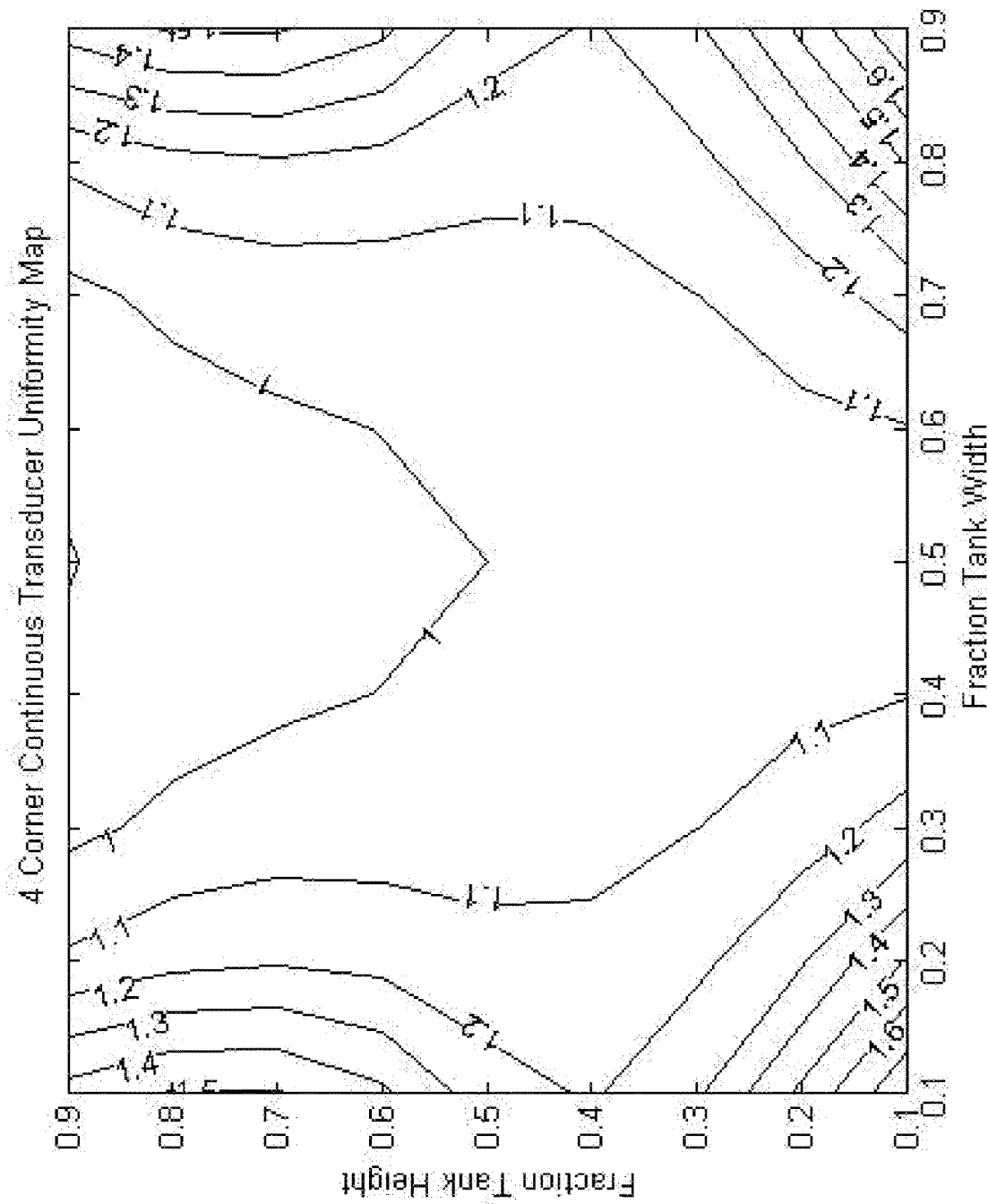
FIG. 23 shows a relative ultrasonic power density map for a working area of an ultrasonic tank having the ultrasonic transducer configuration of FIG. 11.

| Configuration | FIG. | Density Map | Relative Ultrasonic Power Range | Standard Deviation | Total Standard Deviation |
|---|---|---|---|---|---|
| 1 | 2 | FIG. 14 | 1.0 to 4.5 | 0.751 | 0.137 |
| 2 | 3 | FIG. 15 | 0.6 to 2.4 | 0.565 | 0.155 |
| 3 | 4 | FIG. 16 | 0.8 to 2.4 | 0.447 | 0.092 |
| 4 | 5 | FIG. 17 | 0.8 to 2.4 | 0.397 | 0.025 |
| 5 | 6 | FIG. 18 | 1 to 1.5 | 0.179 | 0.021 |
| 6 | 7 | FIG. 19 | 0.9 to 1.5 | 0.205 | 0.015 |
| 7 | 8 | FIG. 20 | 0.9 to 1.4 | 0.177 | 0.029 |
| 8 | 9 | FIG. 21 | 0.9 to 1.4 | 0.173 | 0.031 |
| 9 | 10 | FIG. 22 | 0.9 to 1.5 | 0.210 | 0.075 |
| 10 | 11 | FIG. 23 | 1 to 1.6 | 0.197 | 0.046 |

As can be seen in Table 1, known configurations 1-4 have a larger relative power density range, standard deviation, and total standard deviation, leading to non-uniform etching of glass substrates. Conversely, configurations 5-10 are expected to result in uniform etching as they fall within the parameters for an ultrasonic tank capable of uniform etching, namely a power density range from about 0.8 to about 1.8, a standard deviation below about 0.35 and/or a total standard deviation below about 0.08. Experimentally, configuration 2 (illustrated in FIG. 3 has been used to etch through and blind vias on large parts that occupy the majority of the working volume of the etch tank 130. We have noted damage in the vias consistent with excessive ultrasonic power in regions with power densities above 1.8. We have also noted defects in via profiles consistent with insufficient ultrasonic power in regions with power densities below 0.8.

It will be apparent to those skilled in the art that various modifications and variations can be made without departing from the spirit or scope of the invention.

What is claimed is:
1. An ultrasonic tank comprising:
    a container;
    an etching solution tank comprising a working area disposed within the container and an etching solution comprising at least one of hydrofluoric acid, nitric acid, hydrochloric acid or sulfuric acid,
    wherein the working area has a center;
    a relative ultrasonic power at the center is 1; and
    the relative ultrasonic power at each point in the working area is in a range from 0.8 to 1.8; and
    a plurality of ultrasonic transducers configured to uniformly etch a glass substrate configured in the container, wherein the plurality of ultrasonic transducers are arranged in a linear array to extend along a length or width of the surface of the container about a perimeter of the etching solution tank in a configuration that provides a standard deviation of relative ultrasonic power within the working area of less than 0.35.
2. The ultrasonic tank of claim 1, wherein the etching solution tank has a quadrilateral cross section, a bottom surface and four surfaces extending vertically from the bottom surface, wherein each of the four surfaces comprise two vertical edges and two horizontal edges and the four surfaces comprise two pairs of opposing surfaces.
3. The ultrasonic tank of claim 2, wherein one of the plurality of ultrasonic transducers extends along the horizontal edges of one of the pairs of opposing surfaces.
4. The ultrasonic tank of claim 3, wherein the plurality of ultrasonic transducers are continuously arranged to extend across one of the pairs of opposing surfaces.
5. The ultrasonic tank of claim 4, wherein the plurality of ultrasonic transducers are continuously arranged to extend across the bottom surface.
6. The ultrasonic tank of claim 2, wherein the plurality of ultrasonic transducers are continuously arranged to extend across an upper portion of one of the pairs of opposing surfaces and to extend across a middle portion of the bottom surface.
7. The ultrasonic tank of claim 1, further comprising a water tank wherein the etching solution tank is disposed within the water tank and the water tank is disposed within the container.
8. The ultrasonic tank of claim 1, wherein the standard deviation of relative ultrasonic power within the working area of less than about 0.25.

9. The ultrasonic tank of claim 1, wherein the relative ultrasonic power at each point in the working area is in a range from about 0.8 to about 1.6.

10. The ultrasonic tank of claim 1, wherein the plurality of ultrasonic transducers are configured to extend along the length of the horizontal edges of the side surfaces of the container, such that there are transducers configured along the length of the bottom two corners and the top two corners of the container.

11. The ultrasonic tank of claim 1, wherein the plurality of ultrasonic transducers are configured in a continuously spaced configuration along the height of the side surfaces of the container and extending along the length of the side surfaces of the container and continuously spaced along the width of the bottom surface of the container and extending along the length of bottom surface of the container.

12. The ultrasonic tank of claim 1, wherein the plurality of ultrasonic transducers are configured in continuously spaced configuration along an upper 80% of the height of the side surfaces of the container and extending along the length of the side surfaces of the container and continuously spaced along a middle 60% of the width of bottom surface of the container and extending along the length of bottom surface of the container.

13. The ultrasonic tank of claim 1, wherein the plurality of ultrasonic transducers are configured in continuously spaced configuration along an upper 70% of the height of the side surfaces of the container and extending along the length of the side surfaces of the container and continuously spaced along a middle 40% of the width of bottom surface of the container and extending along the length of bottom surface of the container.

14. The ultrasonic tank of claim 1, wherein the plurality of ultrasonic transducers are configured in continuously spaced configuration along a height of side surfaces of the container and extending along the length of side surfaces of the container.

15. The ultrasonic tank of claim 1, wherein the plurality of ultrasonic transducers are configured in continuously spaced configuration along an upper 40% of the height of each side surface of the container and extending along the length of side surfaces of the container; continuously spaced along a lower 20% of the height of each side surface of the container and extending along the length of side surfaces of the container; continuously spaced along a left 20% of the width of bottom surface of the container and extending along the length of bottom surface of the container; and continuously spaced along a right 20% of the width of bottom surface of the container and extending along the length of bottom surface of the container.

16. A glass etching system, comprising:
a glass substrate; and
an ultrasonic tank comprising:
  a container;
  an etching solution tank disposed within the container, the etching solution tank comprising a working area for etching the glass substrate and an etching solution comprising at least one of hydrofluoric acid, nitric acid, hydrochloric acid or sulfuric acid; and
  a plurality of ultrasonic configured to uniformly etch a glass substrate configured in the container, wherein the plurality of ultrasonic transducers are arranged in a linear array to extend along a length or width of the surface of the container about a perimeter of the etching solution tank in a configuration that provides a standard deviation of relative ultrasonic power within the working area of less than about 0.35;
  wherein the working area has a center;
  a relative ultrasonic power at the center is 1; and
  the relative ultrasonic power at each point in the working area is in a range from 0.8 to 1.8.

17. The glass etching system of claim 16, wherein the glass substrate comprises at least one pin hole.

18. The glass etching system of claim 16, wherein the etching solution tank has a quadrilateral cross section, a bottom surface and four surfaces extending vertically from the bottom surface, wherein each of the four surfaces comprise two vertical edges and two horizontal edges and the four surfaces comprise two pairs of opposing surfaces.

19. The glass etching system of claim 18, wherein one of the plurality of ultrasonic transducers extends along the horizontal edges of one of the pairs of opposing surfaces.

20. The glass etching system of claim 19, wherein the plurality of ultrasonic transducers is continuously arranged to extend across one of the pairs of opposing surfaces.

21. The glass etching system of claim 20, wherein the plurality of ultrasonic transducers is continuously arranged to extend across the bottom surface.

22. The glass etching system of claim 18, wherein the plurality of ultrasonic transducers are continuously arranged to extend across an upper portion of one of the pairs of opposing surfaces and to extend across a middle portion of the bottom surface.

23. The glass etching system of claim 16, further comprising a water tank wherein the etching solution tank is disposed within the water tank and the water tank is disposed within the container.

24. The glass etching system of claim 16, wherein the standard deviation of relative ultrasonic power within the working area of less than about 0.25.

25. The glass etching system of claim 16, wherein the relative ultrasonic power at each point in the working area is in a range from about 0.8 to about 1.6.

26. The glass etching system of claim 16, wherein the plurality of ultrasonic transducers are configured to extend along the length of the horizontal edges of the side surfaces of the container, such that there are transducers configured along the length of the bottom two corners and the top two corners of the container.

27. The glass etching system of claim 16, wherein the plurality of ultrasonic transducers are configured in a continuously spaced configuration along the height of the side surfaces of the container and extending along the length of the side surfaces of the container and continuously spaced along the width of the bottom surface of the container and extending along the length of bottom surface of the container.

28. The glass etching system of claim 16, wherein the plurality of ultrasonic transducers are configured in continuously spaced configuration along an upper 80% of the height of the side surfaces of the container and extending along the length of the side surfaces of the container and continuously spaced along a middle 60% of the width of bottom surface of the container and extending along the length of bottom surface of the container.

29. The glass etching system of claim 16, wherein the plurality of ultrasonic transducers are configured in continuously spaced configuration along an upper 70% of the height of the side surfaces of the container and extending along the length of the side surfaces of the container and continuously spaced along a middle 40% of the width of bottom surface of the container and extending along the length of bottom surface of the container.

30. The glass etching system of claim 16, wherein the plurality of ultrasonic transducers are configured in continuously spaced configuration along a height of side surfaces of the container and extending along the length of side surfaces of the container.

31. The glass etching system of claim 16, wherein the plurality of ultrasonic transducers are configured in continuously spaced configuration along an upper 40% of the height of each side surface of the container and extending along the length of side surfaces of the container; continuously spaced along a lower 20% of the height of each side surface of the container and extending along the length of side surfaces of the container; continuously spaced along a left 20% of the width of bottom surface of the container and extending along the length of bottom surface of the container; and continuously spaced along a right 20% of the width of bottom surface of the container and extending along the length of bottom surface of the container.

* * * * *

UNITED STATES PATENT AND TRADEMARK OFFICE
CERTIFICATE OF CORRECTION

PATENT NO. : 11,610,783 B2
APPLICATION NO. : 14/810967
DATED : March 21, 2023
INVENTOR(S) : John Tyler Keech et al.

Page 1 of 1

It is certified that error appears in the above-identified patent and that said Letters Patent is hereby corrected as shown below:

On the Title Page

On the page 2, in Column 2, Item (56) under "Other Publications", Lines 4-5, delete "Tranlsation" and insert -- Translation --.

In the Specification

In Column 1, Line 9, delete "62/030839" and insert -- 62/030,839 --.

In the Claims

In Column 11, Line 57, in Claim 16, after "ultrasonic" insert -- transducer --.

Signed and Sealed this
Eighth Day of August, 2023

Katherine Kelly Vidal
*Director of the United States Patent and Trademark Office*